United States Patent
Chuyanov et al.

(10) Patent No.: US 8,711,894 B2
(45) Date of Patent: *Apr. 29, 2014

(54) HIGH BRIGHTNESS LASER DIODE MODULE

(75) Inventors: Vadim Chuyanov, Oxford, MA (US); Alexey Komissarov, Charlton, MA (US)

(73) Assignee: IPG Photonics Corporation, Oxford, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/784,946

(22) Filed: May 21, 2010

(65) Prior Publication Data

US 2010/0226405 A1    Sep. 9, 2010

Related U.S. Application Data

(62) Division of application No. 12/215,362, filed on Jun. 26, 2008, now Pat. No. 7,773,655.

(51) Int. Cl.
*H01S 5/00* (2006.01)

(52) U.S. Cl.
USPC ............. 372/50.12; 372/50.121; 372/23

(58) Field of Classification Search
USPC .......... 372/36, 23, 50.12, 50.23; 382/128; 359/641
See application file for complete search history.

(56) References Cited

U.S. PATENT DOCUMENTS

| | | | | |
|---|---|---|---|---|
| 5,148,441 | A * | 9/1992 | Itai | 372/70 |
| 5,319,528 | A * | 6/1994 | Raven | 362/553 |
| 6,124,973 | A * | 9/2000 | Du et al. | 359/618 |
| 7,773,655 | B2 * | 8/2010 | Chuyanov et al. | 372/50.23 |
| 2002/0036821 | A1 * | 3/2002 | Hollemann et al. | 359/342 |
| 2004/0114648 | A1 * | 6/2004 | Nagano et al. | 372/36 |
| 2006/0280209 | A1 * | 12/2006 | Treusch et al. | 372/32 |
| 2008/0310027 | A1 * | 12/2008 | Wilson et al. | 359/641 |

* cited by examiner

*Primary Examiner* — Jessica Stultz
*Assistant Examiner* — Tuan Nguyen
(74) *Attorney, Agent, or Firm* — Yuri Chuyanov; Timothy J King

(57) ABSTRACT

A high-brightness laser module is configured with a beam-compression unit capable of reducing a diameter of parallel light beams which are emitted by respective spaced apart individual laser diodes. The module further has an objective lens configured to losslessly launch the light with the reduced diameter into a fiber.

4 Claims, 4 Drawing Sheets

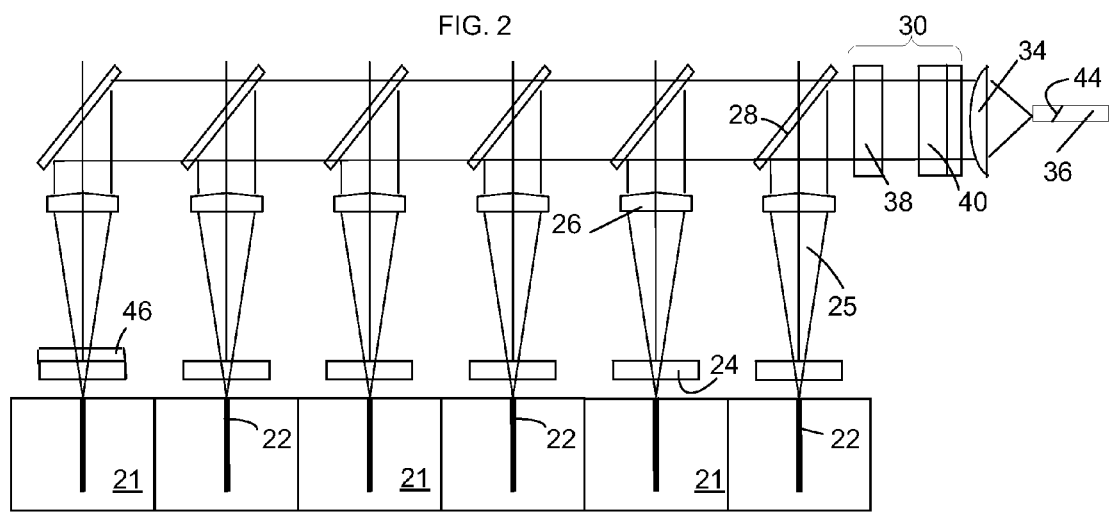
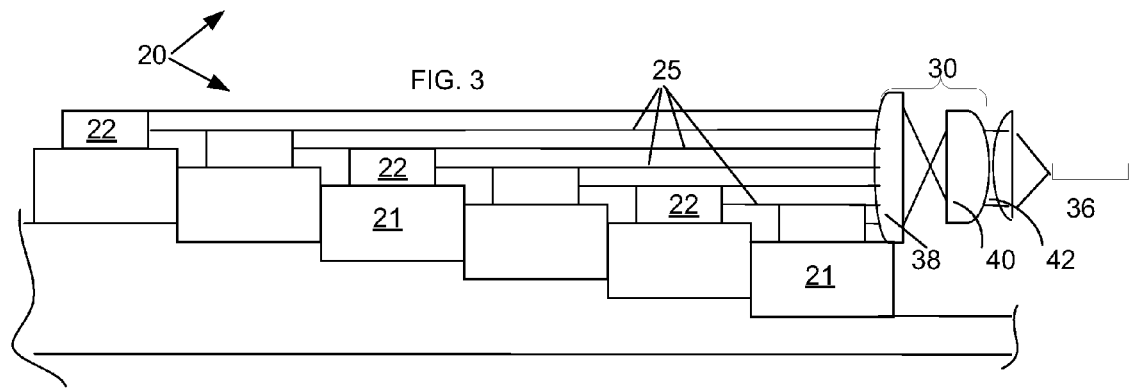

$$\frac{D_2}{D_1} = \frac{f_1}{f_2}$$

HIGH BRIGHTNESS LASER DIODE MODULE

CROSS REFERENCE TO RELATED APPLICATION

This application is a division of U.S. application Ser. No. 12/215,362 filed on Jun. 26, 2008 now U.S. Pat. No. 7,773,655.

BACKGROUND OF THE DISCLOSURE

1. Field of the Disclosure

The present invention relates to a laser module, and more particularly, to the laser module that uses an optical system to converge a group of laser beams radiated from a plurality of independent laser diodes into a resultant laser beam coupled into an optical fiber.

2. Prior Art

High-power and high-brightness semiconductor laser sources which have high efficiency are desirable for a variety of applications including machining operations such as cutting and welding, as well as optically pumping other lasers. Current high-power diode laser sources are somewhat limited in their intrinsic properties, such as the insufficient brightness and power of their output beams at least for certain laser geometries. For example, prior methods of pumping small-diameter rod lasers required the use of specialized and expensive optics to obtain reasonable coupling efficiencies.

One of the known configurations of a laser module that may have several applications includes an individual diode-lasers (edge-emitting semiconductor-lasers) providing an efficient source of relatively bright light. Light is emitted from an aperture that has, for example, a height of between about 1.0 micrometers (.mu.m) and 2.0 .mu.m and a width depending on the output power required from the individual diode laser with the width being greater the greater power required. This width can be as large as few hundreds micrometers. The height and width directions of the emitting aperture are usually termed the fast and slow axes, respectively, by practitioners of the art. The quality of a beam emitted from a diode-laser is high in the fast-axis direction but low in the slow-axis direction, with the slow-axis quality being lower the wider the aperture.

An individual diode-laser of the known prior art typically does not emit sufficient power for the applications being considered here. When more power is required than one diode-laser can supply, it is a usual commercial practice to provide a linear diode-laser array, commonly referred to as a diode-laser bar. In such an array, a plurality of diode-lasers (emitters) are formed on a single substrate (the "bar") so that the emitting apertures of the emitters are aligned in the slow axis direction. The light from all of the emitters must be collected by an optical system of some kind and focused on material to be processed. Such a system requires a complicated arrangement of cylindrical and circular lens elements. Further, the emitters, being on a common substrate, must be connected electrically in parallel. This creates a requirement for a high-current power supply. The cost of such power supplies rises in proportion to the deliverable current.

With the advent of relevant technologies, individual laser diodes have become more powerful. Yet, the power produced by even the most sophisticated individual laser cannot adequately address the needs for the above-discussed applications.

FIG. 1 illustrates a laser diode module 10 disclosed in copending application Ser. No. 12/215,362 which is incorporated herein in its entirety. The module is provided with a few individual laser diodes 4. Each of laser diodes 4 is associated with a group of optical elements including fast- and slow-axis lenses 6, 8, respectively and a deflecting mirror 5. The laser diodes 4 with respective groups of optical components are mounted to a housing 2 in a step-wise manner one above the other to produce three parallel light beams which are collected by an objective lens 7. The objective lens is configured to couple the light from all three into an optical fiber 9. The power produced by the module is relatively high while the module has a space-effective structure.

Still the power demands in certain applications cannot be met by the above discussed structure. The increase of the output power of the module by increasing the number of diodes is the subject of trade-off: the more diodes the bulkier and longer the module. Considering the demand for smaller structures, this solution does not seem to be practical.

Accordingly, a need exists for powerful laser diode modules overcoming the above-discussed limitations of the known laser diode modules.

SUMMARY OF THE DISCLOSURE

This objective is satisfied by the disclosed laser diode module configured with a novel geometry that allows for efficient coupling of the output of a plurality of independent laser diodes into the output fiber of the module. The module is configured with a single case package which houses a plurality of independent laser diodes, outputting respective light beams, and a plurality of light guiding optical components arranged in multiple groups. The groups, each having a combination of sequentially mounted and spaced fast- and slow-axes collimators and a deflecting mirror, are arranged relative to one another so as to output a plurality of parallel light beams generated by respective laser diodes.

The collimated light beams serve as the respective incident beams with a vertical dimension many times greater than the core diameter of the output fiber. Typically, an objective circular lens has been used by the known prior art to effectively couple a few light beams into the output fiber. However, when the number of linearly positioned diodes exceeds, for example, three, the respective emitted beams simply cannot be collected by a reasonably dimensioned objective lens.

In accordance with the concept of the present disclosure, the module further includes an optical beam compression unit mounted in the housing between the deflecting mirrors and the regularly sized objective lens. The optical compression unit effectively narrows the vertical dimension of the cross-section of the collimated light beams which is focused by the standard objective lens so as to be coupled into the output fiber.

According to one of the embodiments of the disclosed module, a plurality of individual laser diode includes more than three laser diodes linearly disposed in the housing. Advantageously, there are six laser diodes linearly arranged in the housing. Each of the laser diodes emits a light beam collimated by a fast/slow-axis lens assembly and further redirected by a deflecting mirror to impinge upon a beam compression unit. The laser diodes and respective groups of the optical components are mounted to the housing in a step-wise manner so as to prevent overlapping between diode-emitted light beams, which, otherwise, may lead to the loss of the output power and/or the distraction of deflecting mirrors.

The beam compression unit may have various configurations each of which is operative to narrow the collimated beams from the respective laser diodes in such a manner that the compressed beams are substantially losslessly coupled into a single objective lens. The latter, in turn, is capable of coupling the narrowed beams into a single fiber. As mentioned above, the disclosed module may be used in a variety of applications requiring, for example, that the module be a stand-alone unit or be used as a pump module. Regardless of the concrete application, the disclosed module generates a high-powered and bright output light.

In accordance with a further embodiment of the disclosure, multiple laser diodes are arranged in two parallel rows spaced in opposite directions from an elongated zigzag arrangement of deflecting mirrors. Viewed in a horizontal plane the lasers of one row alternate with the lasers of the other row in the longitudinal direction. In vertical plane, the lasers of both rows are arranged in a step-wise manner along the longitudinal axis of the mirror arrangement with each subsequent laser of one row being located lower than the previous laser of the other row to define a ladder-shaped structure.

BRIEF DESCRIPTION OF THE DRAWINGS

The above and other features and advantages of the disclosed module will become more readily apparent from a specific description accompanied by the following drawings, in which:

FIG. 2 is a top view of one of the embodiments of the presently disclosed module.

FIG. 3 is a side view of the laser module of FIG. 2.

SPECIFIC DESCRIPTION

Figure 1:
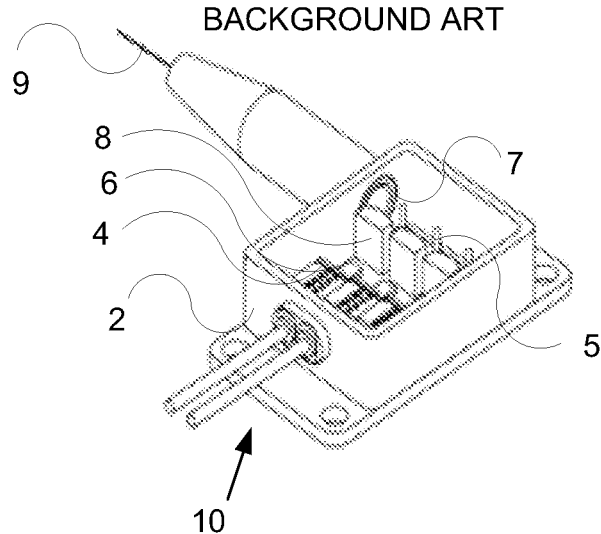
FIG. 1 is a laser module of the known prior art.

Reference will now be made in detail to the disclosed system. Wherever possible, same or similar reference numerals are used in the drawings and the description to refer to the same or like parts or steps. The drawings are in simplified form but substantially corresponding to precise scale. The terms "horizontal plane" and "vertical plane" are used exclusively with respect to the plane of the sheet. For purposes of convenience and clarity only, the terms "connect," "couple," and similar terms with their inflectional morphemes do not necessarily denote direct and immediate connections, but also include connections through mediate elements or devices.

A laser diode module configured in accordance with the disclosure provides for a powerful and bright light by utilizing a plurality of independent diode lasers each emitting a light beam. The disclosed module is configured with beam-compressing optics operative to reduce the cross-sectional area of collimated lights so as to effectively and losslessly couple all the collimated beams from respective laser diodes into an objective lens and further into an output fiber. As disclosed below, the module is configured with two different geometries.

FIGS. 2 and 3 illustrate the first embodiment of a laser diode module 20 configured in accordance with the present disclosure. The module 20 includes a plurality of individual sources of radiation such as a laser diode 22 generating respective laser lights 25 at a diode laser wavelength along an upstream stretch of light path. Each laser diode 22 is aligned with a collimating lens assembly along the optical axis of the laser diode and located downstream therefrom.

As well known to one of ordinary skills in the optics, each laser diode light 22 expands along fast and slow axes both being perpendicular to the beam direction, and also to each other. Accordingly, the collimating lens assembly is configured with a fast axis collimator 24 and a slow axis collimator 26 processing respective fast and slow components of light 25 in the manner known to the one of ordinary skills in the laser arts.

The collimated light impinges upon a deflecting mirror 28 reflecting the light along the downstream stretch of the light path so that the downstream and upstream stretches of the path extend substantially perpendicular to one another. The reflected lights emitted by respective laser diodes 22 do not overlap one another, as shown in FIG. 3, because laser assemblies, each including laser diodes 22 and associated light-guiding components, are mounted to the bottom of the housing so as to define a linear, ladder-shaped configuration with each subsequent laser assembly being located below the previous one. Given as an example, FIGS. 2 and 3 illustrate six diodes 22 mounted on respective support/heat sink surfaces 21. The diodes 22, thus, define a six-step ladder allowing multiple laser lights 25 deflected from respective mirrors 28 to propagate along the downstream stretch of the light path.

In many respects the above disclosed configuration is similar to the structure disclosed in greater detail in co-pending patent application Ser. No. 12/215,362 teaching a combination of maximum three laser diodes and fully incorporated herein by reference. The laser diode lights reflected by three deflecting mirrors, as taught in the co-pending application, form a beam that can be substantially losslessly coupled into an objective lens and further into an output fiber. However, if more than three laser diodes were used in the structure disclosed in the co-pending application, losses may be significant.

To avoid the loss of light, disclosed module 20 is provided with a beam compression unit 30, as illustrated in FIGS. 2 and 3. The compression unit 30 is, thus, configured to reduce the cross section of reflected light beams 25 emitted by respective laser diodes 22 and further reflected by respective deflecting mirrors 28. Upon being compressed by light-compressor unit 30, compressed beams 25 impinge upon a circular objective lens 34 coupling the laser diode light into an output fiber 36 of module 20.

The optical configuration of compressor unit 30 allows for conversion of multiple input parallel light beams, together having a first cross-section of a first diameter, into output parallel beams defining a second cross-section which has a second diameter smaller than that one of the first cross-section. As a consequence, the light beam compressor optically operates in the same manner as a standard telescope and, thus, may include two optical components, such as cylindrical lenses 38 and 40.

The cylindrical lens 38 has a planoconvex configuration, whereas cylindrical lens 40 is planoconcave if considered in the direction of propagation of lights 25. Together lenses 38 and 40 control transition of deflected parallel light beams 25 so that the cumulative diameter of these beams impinging upon lens 38 is substantially greater than the diameter of laser diode light beam 42 (FIG. 3) at the output of lens 40. The lenses 38 and 40 are coaxial with lens 38 having a focal length $f_1$ twice the focal length $f_2$ of lens 40. As a result of the telescope structure, parallel light beams are focused by objective circular lens 34 which converges light beams 25 in a small-diameter bundle of light 42 further launched into fiber 36. Thus, beam compression unit or telescope 30 compensates for the beam divergence in the slow axis and the lack of parallelism of the arrays along the fast axis.

When coupling laser diodes to the optical fibers, the important parameters to consider are the size of aperture, fast and slow axis divergences of the laser and the numerical aperture of the fiber. Refocusing the light from the laser diodes inside the modal diameter of the optical fiber and reduction of the incidence angles of the light within fiber's numerical aperture is instrumental for efficient coupling. The configuration of laser diodes 22, each of which may have, for example, the length of about between 3 and 4.5 mm and the width of about 90μ, conditions propagation of beams 32 along a horizontal axis of telescope 30, as shown in FIG. 2, so that the light has a plurality of spatial modes. In contrast, along a vertical axis, as illustrated in FIG. 3, the light has substantially a single spatial mode. Accordingly, beam compression unit 30 is preferably configured to collimate the light beams propagating along the vertical axis while leaving the horizontal axis divergence unchanged. However, the scope of the disclosure includes the possibility of compressing the light beam along the horizontal axis as well. One of the difficulties associated with the collimation of light along the horizontal axis is that the narrower the light beam, the greater the divergence thereof.

Figure 4:
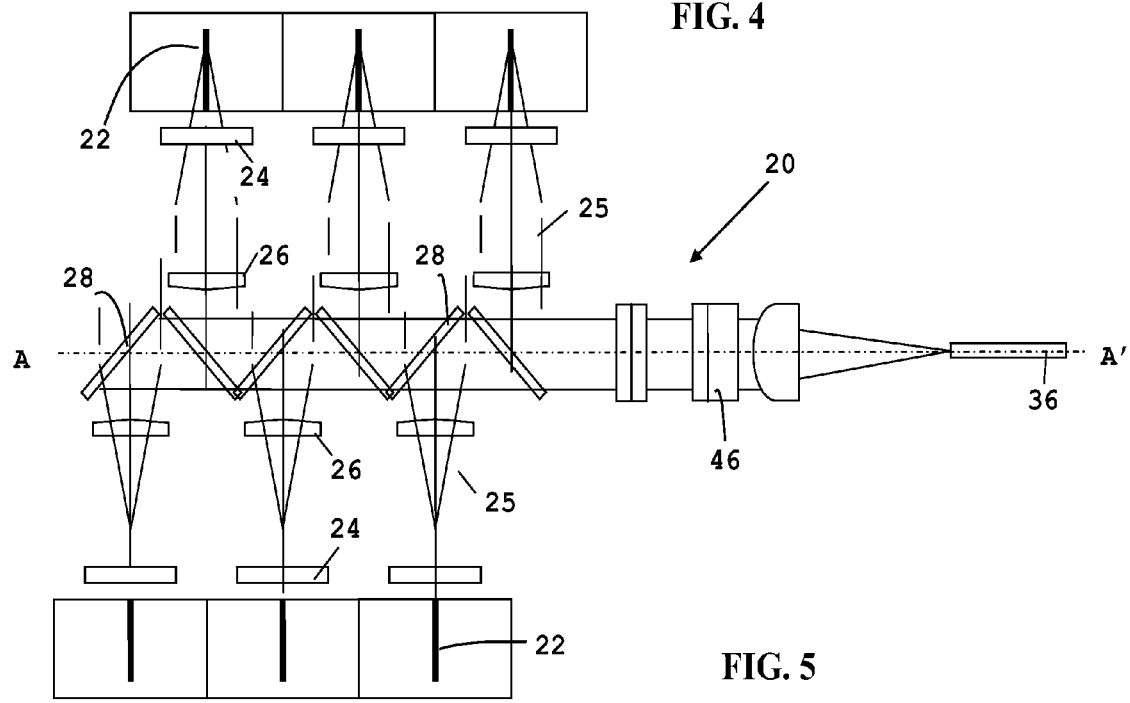
FIG. 4 is a top view a further embodiment of the presently disclosed module.
Figure 5:
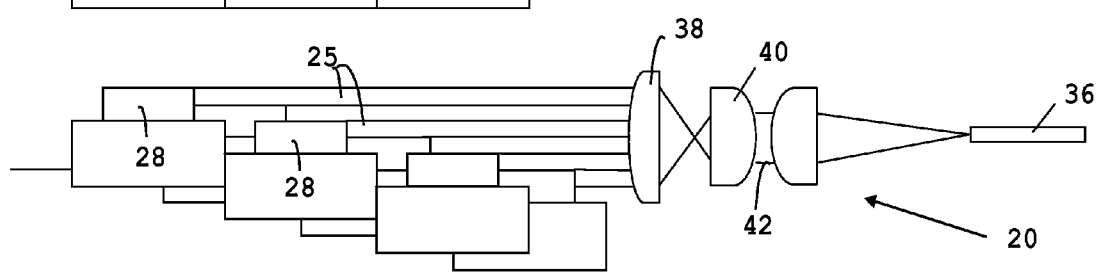
FIG. 5 is a side view of the module of FIG. 4.

FIGS. 4 and 5 illustrate a further geometrical modification of the disclosed laser module 20. While multiple laser assemblies, each including laser diode 22, fast and slow axes lens assembly 24, 26 and deflecting mirror 28, are configured similar to those shown in FIGS. 2 and 3, module 20 are more compact and exhibits better optical characteristics. The excellent performance of the configuration shown in FIGS. 4 and 5 is explained by a relatively short distance between the apertures of respective laser diodes 22 and the receiving end of fiber 36 as compared to the previously disclosed embodiment.

As shown in FIG. 4, module 20 is configured with two rows of laser diodes 22 uniformly spaced in opposite directions in a horizontal plane from a horizontal axis A-A' which extends parallel to the direction of propagation of light beams 25 and coincides with the optical axis of beam compression unit 30. The diodes of one row and respective laser diodes of the other row are axially offset relative to one another. Accordingly, laser diodes 22 of the first alternate with laser diodes 22 of the second row in the direction of propagation of light beams 25.

The deflecting mirrors 28 associated with respective laser diodes 22 are arranged in a zigzag configuration extending along the axis of symmetry. Such a configuration of mirrors 28 along with the ladder-like configuration of multiple diodes 22 allows for a plurality of parallel beams 25 which do not overlap with one another, as shown in FIG. 5. The zigzag arrangement may include a plurality of separate deflecting mirrors 28 or a single mirror component.

FIG. 5 illustrates propagation of light beams 25 along the vertical axis of beam compression unit or telescope 30. In this embodiment, like in the embodiment of FIGS. 2 and 3, each subsequent laser diode 22 along with the associated collimator lens assembly and deflecting mirror 28, is mounted to the bottom of the housing at a level lower than the previous laser arrangement. Consequently, not only laser diodes of the respective opposite rows alternate with one another, but the diodes along with respective lenses 24, 26 and deflecting mirrors 28 define a step-wise structure gradually descending in the direction of propagation of light beams 32 in the plane perpendicular to the sheet.

The telescope or beam compression unit 30 includes planoconvex lens 38 compressing light beams 25 preferably along the vertical axis of the telescope, and further a planoconcave lens 40 configured to output pump light beam 42 with a beam cross-section smaller than that one at the entrance to lens 38. Thereafter reduced pump light beam 42 is focused by circular lens 34 configured to couple the light beam into output fiber 36.

Figure 6:
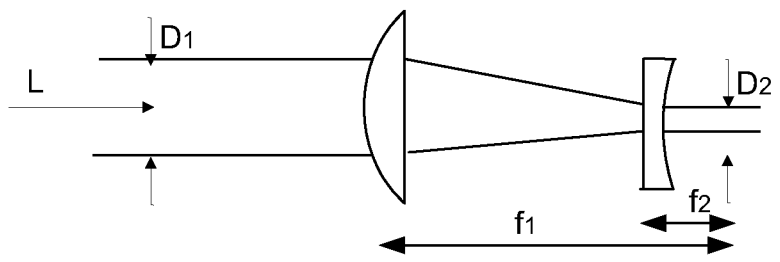
FIGS. 6-9 illustrate respective configurations of a compressing unit utilizable in the embodiments of the present disclosure.
Figure 7:
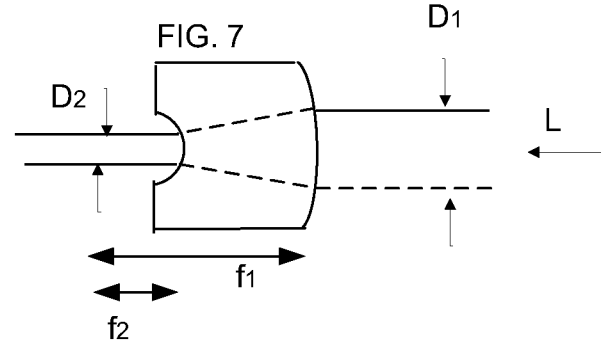
Figure 8:
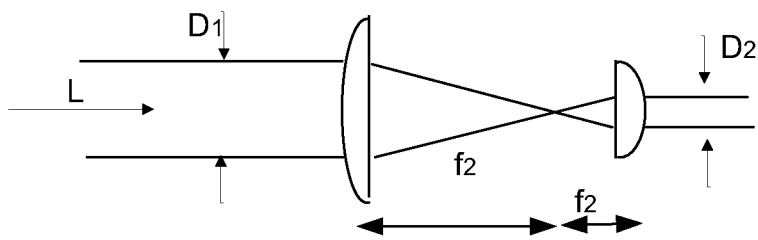

Referring to FIGS. 6-9, beam compression unit 30 may include numerous configurations all of which can be easily incorporated in the configurations shown in respective FIGS. 2-5. For example, FIG. 6 illustrates a typical Galilean telescope. FIG. 7, like FIG. 6, shows a Galilean configuration. However, in contrast to a two-lens structure of FIG. 6, the telescope of FIG. 7 is a monolithic meniscus structure. Other configurations are also can be made monolithic. FIG. 8, like FIGS. 2-5, illustrates a Keplerian telescope. All of the telescopes of respective FIGS. 6-8 are configured in accordance with the following relationship:

$$D_1/D_2 = f_1/f_2$$

wherein $D_2$ and $D_1$ are diameters of respective output and input light beams, and $f_2$, $f_1$ are focal lengths of respective lens.

Figure 9:
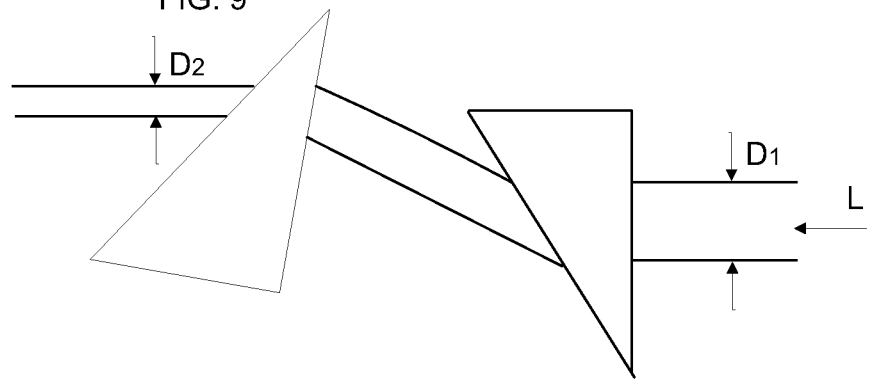

Finally, FIG. 9 illustrates anamorphic prism pair. As can be seen, a diameter D1 of a light beam propagating in a direction L is greater than a diameter D2 of the output compressed beam.

Turning briefly to FIG. 2, output fiber 36 may be provided with a slanted fiber grating 44 preventing backreflection of the Raman component of a main signal emitted by a gain block, which is not shown here, towards laser diodes 22. Furthermore, each of planar surfaces of lenses 24, 26, 38, 40 and 34 as well as deflecting mirror 28 may be covered by a dielectric layer 46 (only one shown) configured to fully reflect the backreflected main signal of the gain block, as disclosed in copending application Ser. No. 12/215,362. The above, of course, is fully applicable to the embodiment illustrated in FIGS. 4 and 5.

Although there has been illustrated and described in specific detail and structure of operations it is clearly understood that the same were for purposes of illustration and that changes and modifications may be made readily therein by those skilled in the art without departing of the spirit and the scope of this invention.

The invention claimed is:

1. A laser diode module centered along an optical axis comprising:

a plurality of spaced individual laser diodes arranged in respective two rows which are spaced laterally equidistantly from the optical axis in opposite directions and extend parallel thereto, the laser diodes emitting respective parallel light beams propagating along respective light paths transversely to the optical axis and without overlapping one another;

a plurality of beam collimating assemblies each aligned with the laser diode and configured with consecutive fast- and slow-axis collimators, respectively which make the beam incident thereupon parallel along respective fast and slow axes;

a plurality of consecutive deflecting mirrors located along the optical axis and each aligned with the laser diode downstream from the collimating assembly so that the light parallel beams reflect from respective deflecting mirrors to propagate parallel to one another and the optical axis and together define an output parallel light beam with a first diameter; and a telescope centered on the optical axis and configured to intercept and compress the output parallel light beam so as to output a compressed parallel light beam with a second diameter smaller than the first diameter, wherein the laser diodes of the two rows alternate with one another along the optical axis.

2. The laser diode module of claim 1 further comprising a focusing lens intercepting the compressed parallel beam downstream from the telescope.

3. A laser diode module centered along an optical axis, comprising:
- a plurality of spaced individual laser diodes arranged in a row which extends parallel to and is spaced laterally from the optical axis, the laser diodes emitting respective non-overlapping light beams transversely to the optical axis along respective uniformly dimensioned paths;
- a plurality of beam collimating assemblies each aligned with the laser diode along the path and configured with consecutive fast- and slow-axis collimators;
- a row of consecutive mirrors extending along the optical axis and located at respective downstream ends of the uniform paths, the mirrors being configured to deflect respective beams parallel to the optical axis, wherein the deflected beams define an output light beam with a first diameter; and
- a telescope centered on the optical axis and configured to intercept and compress the output parallel light beam so as to output a compressed parallel light beam with a second diameter smaller than the first diameter.

4. The laser diode module of claim 3 further comprising another row of laser diodes, the rows of laser diodes being spaced equidistantly from the optical axis in respective opposite lateral directions, wherein the laser diodes of one of the rows alternate with laser diodes of the second row along the optical axis.

* * * * *